United States Patent [19]

Kamata

[11] Patent Number: 5,917,318
[45] Date of Patent: Jun. 29, 1999

[54] HIGH-SPEED RESPONSIVE POWER SUPPLY FOR MEASURING EQUIPMENT

[75] Inventor: Masayuki Kamata, Tokyo, Japan

[73] Assignee: Ando Electric Co., Ltd., Tokyo, Japan

[21] Appl. No.: 08/801,166

[22] Filed: Feb. 18, 1997

[30] Foreign Application Priority Data

Feb. 28, 1996 [JP] Japan .................................. 8-067327

[51] Int. Cl.$^6$ .................................................. G01R 31/02
[52] U.S. Cl. .................... 324/158.1; 324/765; 323/909
[58] Field of Search ................................ 324/158.1, 771, 324/765; 323/311, 313, 909

[56] References Cited

U.S. PATENT DOCUMENTS

| | | | |
|---|---|---|---|
| 5,424,629 | 6/1995 | Fujiwara et al. ......................... | 323/349 |
| 5,481,551 | 1/1996 | Nakano et al. ...................... | 324/73.1 X |
| 5,523,978 | 6/1996 | Yoon et al. .............................. | 365/229 |
| 5,731,700 | 3/1998 | McDonald ........................... | 324/158.1 |

*Primary Examiner*—Glenn W. Brown
*Attorney, Agent, or Firm*—Flynn, Thiel, Boutell & Tanis, P.C.

[57] ABSTRACT

A high-speed responsive power supply for measuring equipment minimizes the heating value of a load current in the high-speed responsive power supply mounted on a test head. In order to achieve the object, the high-speed responsive power supply for measuring equipment is constructed as follows. The high-speed responsive power supply is incorporated inside the test head which a device under test is detachably mounted on. A remote sensing power supply provided inside a tester body rack disposed a specific distance from the test head feeds a power supply voltage to the high-speed responsive power supply. From the high-speed responsive power supply, an output supply voltage is fed to the device under test. The remote sensing power supply controls the power supply voltage so that a potential difference between the output supply voltage and the power supply voltage will be minimized within a range where the high-speed responsive power supply operates normally. At the same time, a reference voltage power supply inside the tester body rack feeds a reference voltage to the high-speed responsive power supply so that the supply voltage will become a set value.

15 Claims, 7 Drawing Sheets

F I G. I

HIGH-SPEED RESPONSIVE POWER SUPPLY FOR MEASURING EQUIPMENT

BACKGROUND OF THE INVENTION

1. Field of the Invention

The present invention relates to a high-speed responsive power supply for use in measuring equipment, for example, in a test head of an IC (integrated circuit) tester disposed with a specific distance apart from the tester body rack containing a controller and a power supply, and the potential difference between the input and the output of the high-speed responsive power supply is designed to be minimized.

2. Description of the Related Art

In a known IC tester, the test head is placed in use about 10 m apart from the tester body rack containing the controller and the power supply. FIG. 6 is a block diagram showing a schematic construction of a conventional IC tester. In FIG. 6, inside an IC tester body rack 1, a transformer 2 is provided which transforms the voltage of an AC power supply 3 into a specific voltage to be applied to a remote sensing power supply 4.

The output terminal of the remote sensing power supply 4 is connected to a test head 8 placed a distance L of about 10 m apart therefrom via a voltage detecting line 6 and a feeder line 7. The output voltage of the remote sensing power supply 4 is supplied to the test head 8 through the feeder line 7. The voltage supplied to the test head 8 is detected through the voltage detecting line 6.

The voltage supplied to the test head 8 (hereinafter, referred to as power supply voltage V1) is applied to a device under test 9 (hereinafter, referred to as DUT) through a feeder line 11. A condenser 10 inside the test head 8 is a power supply bypass condenser for the DUT 9 that serves to lower the AC impedance of the power supply inside the test head 8.

Next, the performance of FIG. 6 will be described. An AC voltage is supplied from the AC power supply 3 to the transformer 2 inside the test body rack 1, and the AC voltage is transformed into a specific voltage by the transformer 2 to be supplied to the remote sensing power supply 4. The voltage rectified and stabilized by the remote sensing power supply 4 is supplied to the test head 8 through the feeder line 7.

Thus, the power supply voltage V1 is applied to the DUT 9 mounted on the test head 8 through the feeder line 11, and thereby a power supply current I1 is fed into the DUT 9. Here, the current is about 1~3 A depending on the DUT 9, and therefore, the voltage fed to the test head 8 from the remote sensing power supply 4 fluctuates.

In order to eliminate this fluctuation, the remote sensing power supply 4 detects the voltage fed to the test head 8 through the voltage detecting line 6. Consequently, a power supply voltage with an error of less than 10 mV can be fed to the DUT 9 via the feeder line 11.

However, in the power supply for the IC tester provided with the remote sensing power supply 4 that has such a voltage detecting line 6 for control of the power supply voltage V1, when the current running through the DUT 9 changes instantaneously by about 1~3 A, the fluctuation of the power supply voltage V1 on the feeder line 11 cannot unavoidably be eliminated.

FIG. 7 illustrates the waveforms of the transient characteristics of the power supply voltage V1 applied to the DUT 9 and the power supply current I1 running through the DUT 9, which are shown by taking on the horizontal axis to represent time ($\mu$s) and the vertical axis to represent the power supply voltage V1 and the power supply current I1.

As clearly seen in FIG. 7, when the power supply current changes instantaneously from 1 A to 3 A, the power supply voltage V1 changes about 2 V in 10 microseconds.

The fluctuation of the power supply voltage V1 accompanied with the change of the power supply current I1 can be reduced to some extent by adjusting the constant (value) of the condenser 10 in the power supply for the test head 8 and by adjusting the operational condition of the sensing power supply 4. However, the voltage fluctuation of about 1~3 V for the microseconds shown in FIG. 7 invariably appears, and has not been avoided in the conventional system.

SUMMARY OF THE INVENTION

The present invention has been made to solve the foregoing problem, and the high-speed responsive power supply for a measuring equipment according to the present invention is provided with a device under test 22 detachably mounted on a test head 21 of measuring equipment 18. A speed responsive power supply 23, incorporated in the test head 21, feeds current to the device under test 22. A remote sensing power supply 25, provided inside a tester body rack 24, disposed a specific distance from the test head 21, feeds a power supply voltage to the high-speed responsive power supply 23. A reference voltage power supply 26, provided inside the tester body rack 24, feeds a reference voltage to the high-speed responsive power supply 23.

According to the invention, the remote sensing power supply 25 controls the power supply voltage V22 so that the potential difference between the output supply voltage V21 to the DUT 22 from the high-speed responsive power supply 23 and the power supply voltage V22 to the high-speed responsive power supply 23 from the remote sensing power supply 25 will be minimized, with the high-speed responsive power supply 23 maintained in a normal operation. The reference voltage power supply 26 controls the reference voltage to be applied to the high-speed responsive power output supply 23 so that the supply voltage V21 fed to the DUT 22 from the high-speed responsive power supply 23 equals a set voltage.

BRIEF DESCRIPTION OF THE DRAWINGS

The present invention will be fully understood from the detailed description given below and from the accompanying drawings of the preferred embodiments of the invention, which, however, should not be taken to limit the specific embodiment, but are for explanation and understanding, in which.

DESCRIPTION OF THE PREFERRED EMBODIMENT

Figure 1:
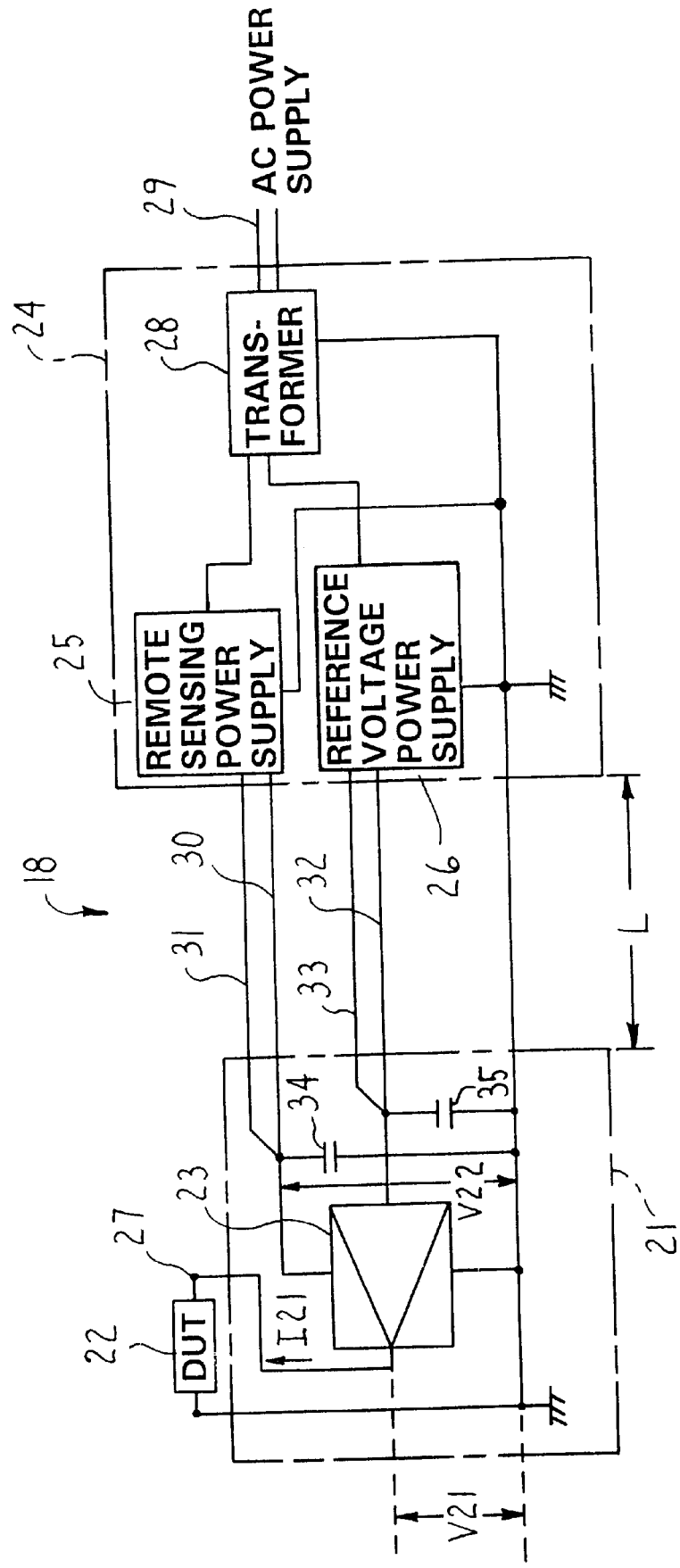
FIG. 1 is a circuit block diagram showing a construction of the high-speed responsive power supply for a measuring equipment relating to the first embodiment according to the present invention.

Next, the first embodiment of the test device or measuring equipment 18 according to the invention will be described with reference to the accompanying drawings. FIG. 1 is a circuit block diagram showing a construction of the first embodiment, which shows a test device 18 such as, for example, an IC tester.

In FIG. 1, the device under test (DUT) 22 is detachably mounted on the test head 21. The high-speed responsive power supply 23 is incorporated into the test head 21, and the output voltage from the high-speed responsive power supply 23, namely, the output supply voltage V21 to the DUT 22 is supplied through a feeder line 27 such that the output of the high-speed responsive power supply 23 is connected to the input of the DUT 22 at the shortest distance.

The body rack 24 of the IC tester is disposed at distance L of about 10 m from the test head 21. The reference voltage power supply 26 as the reference voltage supply means is provided inside the tester body rack 24.

Furthermore, a transformer 28 is also provided inside the tester body rack 24. The transformer 28 is connected to an AC power supply 29, and the AC voltage from the AC power supply 29 is transformed by the transformer 28 into specific voltages applied to the remote sensing power supply 25 and the reference voltage power supply 26.

When the transformer 28 feeds an AC voltage to the remote sensing power supply 25, the power supply 25 rectifies the AC voltage into the specific power supply voltage V22 and feeds it to the high-speed responsive power supply 23 inside the test head 21 through a feeder line 30.

The remote sensing power supply 25 detects the power supply voltage V22 through a voltage detecting line 31. The remote sensing power supply 25 controls the power supply voltage V22 so that the potential difference (V21–V22) between the supply voltage V21 fed to the DUT 22 from the high-speed responsive power supply 23 and the power supply voltage V22 fed to the high-speed responsive power supply 23 from the remote sensing power supply 25 will be minimized with the high-speed responsive power supply 23 maintained in a normal operation.

Similarly, the reference voltage power supply 26 feeds the reference voltage to the high-speed responsive power supply 23 through a feeder line 32. The reference voltage is also detected by the reference voltage power supply 26 through a voltage detecting line 33 and is controlled by the reference voltage power supply 26 so that the output supply voltage V21 will become equal to a set value.

Furthermore, the test head 21 is equipped with a power supply bypass condenser 34 connected across the input terminals of the high-speed responsive power supply 23, namely, in parallel to the power supply voltage V22, and a power supply bypass condenser 35 for the reference voltage of the high-speed responsive power supply 23 connected in parallel to the reference voltage.

Figure 2:
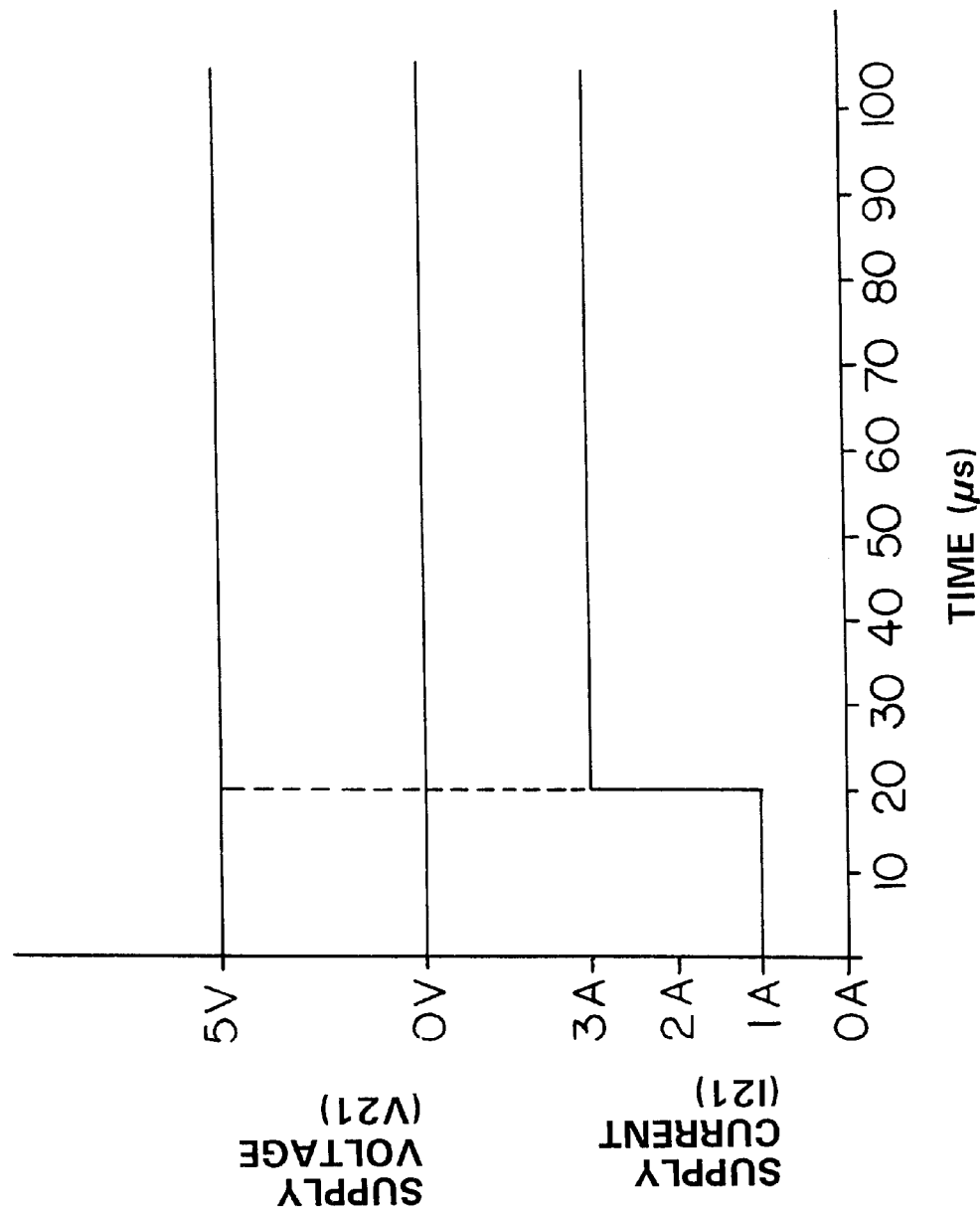
FIG. 2 is a transient response characteristics of the supply voltage V21 and the power supply current I21, for explaining the performance of the circuit shown in FIG. 1.

Next, the performance of the first embodiment will be described with reference to FIG. 2. FIG. 2 shows transient response characteristics of the high-speed responsive power supply 23, in which the horizontal axis is taken on as representing time ($\mu$s) and the vertical axis is taken on as representing the supply voltage V21 and the supply current I21.

The AC voltage from the AC power supply 29 is applied to the transformer 28 inside the tester body 24. After the AC voltage is transformed into specific AC voltages by transformer 28, the AC voltages are each applied to the reference voltage sensing power supply 25 and the remote power supply 26.

The remote sensing power supply 25, receiving the AC output voltage from the transformer 28, rectifies the AC output voltage into a specific stabilized DC voltage V22. The power supply voltage V22 is fed to the high-speed responsive power supply 23 inside the test head 21 through the feeder line 30.

In the same manner, the reference voltage power supply 26, receiving the AC output voltage from the transformer 28, rectifies the AC output voltage into a specific DC reference voltage, which is fed to the high-speed responsive power supply 23 inside the test head 21 through the feeder line 32.

The high-speed responsive power supply 23, receiving the power supply voltage V22, feeds the supply voltage V21 to the DUT 22 through the feeder line 27. Thereby, the supply current I21 runs into the DUT 22 from the output of the high-speed responsive power supply 23 through the feeder line 27.

The power supply voltage V22 at that moment is detected by the remote sensing power supply 25 through the voltage detecting line 31, and the reference voltage is detected by the reference voltage power supply 26 through the voltage detecting line 33.

The remote sensing power supply 25 controls the power supply voltage V22 on the basis of the detected voltage of the power supply voltage V22 in such a manner that the heating value of the high-speed responsive power supply 23 is made to be minimized, and at the same time the potential difference between the output supply voltage V21 and the power supply voltage V22, that is, (V21–V22) is made to be minimized within the stable operation range of the high-speed responsive power supply 23.

In the same manner, the reference voltage power supply 26 controls the reference voltage on the basis of the detected voltage of the reference voltage so that the supply voltage V21 fed to the DUT 22 from the high-speed responsive power supply 23 will become equal to a set value.

With the circuit thus constructed, as shown in FIG. 2, even if the power supply current I21 with a high level, for example, 1A to 3 A, is run into the DUT 22 from the high-speed responsive power supply 23 through the feeder line 27, the output supply voltage V21 fed to the DUT 22 virtually will not fluctuate.

If the operation range of the high-speed responsive power supply 23 thus constructed is set such that the set voltage is 3V to 30 V and the power supply current is 5 A and the potential difference between the output supply voltage V21 and the power supply voltage V22 is set to, for example, 2 V constant, the maximum heating value of the high-speed responsive power supply 23 is made to be 5 A×(V22–V21)=5 A×2 V=10 Watts. Furthermore, the high-speed responsive power supply 23 will not generate noises as a switching power supply.

Figure 3:
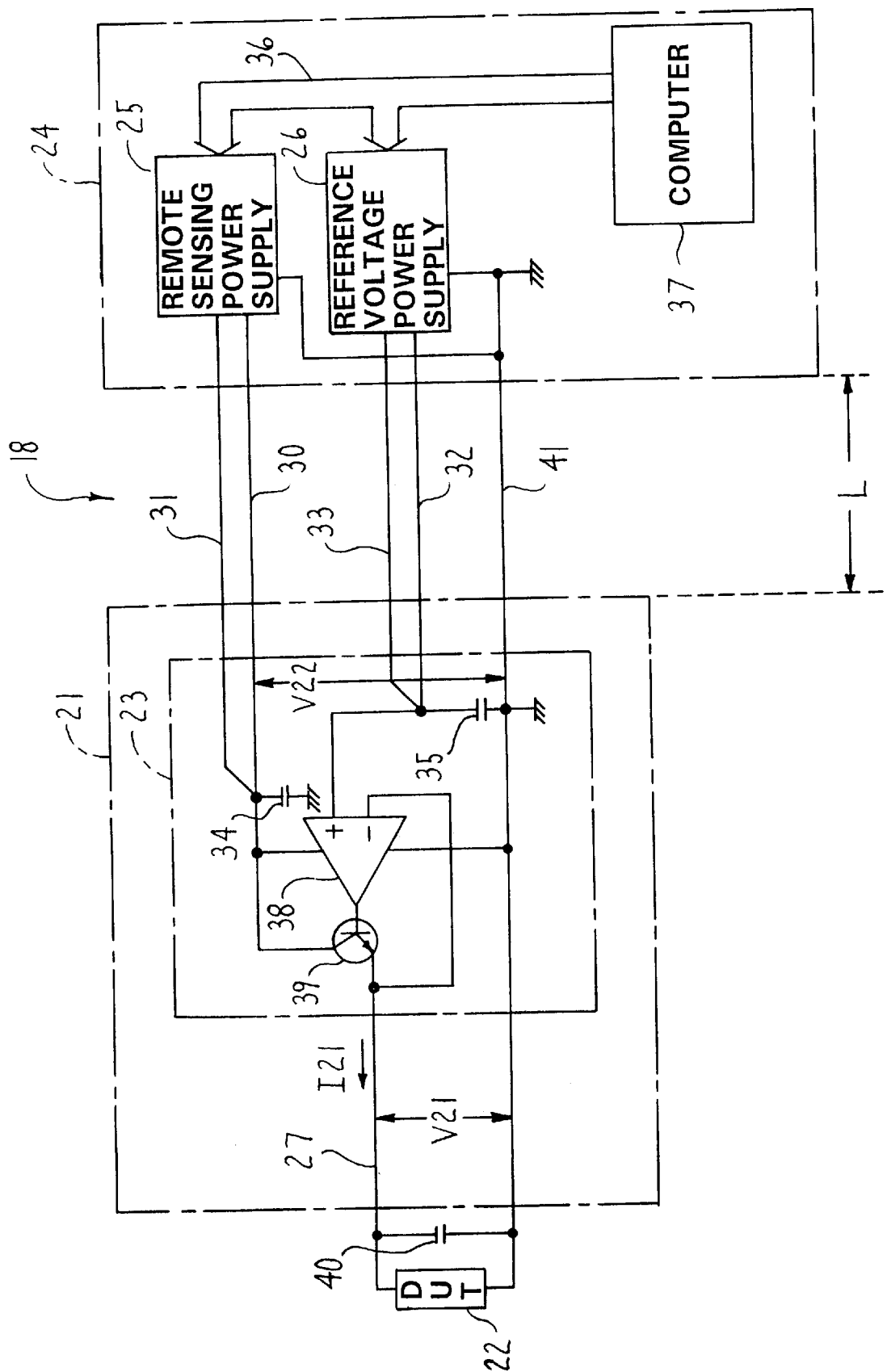
FIG. 3 is a circuit block diagram showing a construction of the high-speed responsive power supply for a measuring equipment relating to the second embodiment according to the invention.

Next, the second embodiment according to the invention will be described with reference to the circuit block diagram of the measuring equipment or test device 18 shown in FIG. 3. In FIG. 3, the same part as in FIG. 1 is given the same reference. The remote sensing power supply 25 and the reference voltage power supply 26 as the reference voltage supply means inside the tester body rack 24 are controlled by a computer 37 through a data bus 36 so as to generate an optional voltage.

Furthermore, the high-speed responsive power supply 23 inside the test head 21 mainly comprises an operational amplifier 38 (hereinafter, referred to as op-amp) and a transistor 39. The reference voltage power supply 26 supplies the reference voltage to a noninversion input terminal of the op-amp 38 through a feeder line 32, and an inversion input terminal (−) of the op-amp 38 is connected to the emitter of the transistor 39.

This reference voltage is detected by the reference voltage power supply 26 through the voltage detecting line 33, which is the same as in FIG. 1. The bypass condenser 35 for the reference voltage is connected between the noninversion input terminal and the earth terminal, that is, between the feeding point of the reference voltage and the earth terminal so as to absorb noises.

The power supply voltage V22 is applied to the op-amp and the corrector of the transistor 39 inside the high-speed responsive power supply 23 from the remote sensing power supply 25 through the feeder line 30. The power supply voltage V22 is detected by the remote sensing power supply 25 through the voltage detecting line 31. The bypass condenser 34 is connected between the feeding point of the power supply voltage V22 and the earth to absorb noises.

The output terminal of the op-amp 38 is connected to the base of the transistor 39 so that the output supply voltage V21 is applied to the DUT 22, between the emitter of the transistor 39 and the earth, through the feeder line 27. A power supply bypass condenser 40 for the DUT 22 is connected in parallel to the DUT 22. Furthermore, a line 41 is the earth line.

In the foregoing construction, the computer 37 controls the remote sensing power supply 25 so that the potential difference between the output supply voltage V21 applied to the DUT 22 from the emitter of the transistor 39 inside the high-speed responsive power supply 23 and the power supply voltage V22 applied to the op-amp 38 and the corrector of the transistor 39 inside the high-speed responsive power supply 23 through the feeder line 30 from the remote sensing power supply 25 can be minimized with the high-speed responsive power supply 23 always kept in the normal operation range. Thereby, the heating value of the high-speed responsive power supply 23 can be controlled to be minimum.

Furthermore, the computer 37 controls the reference voltage power supply 26 and the reference voltage applied to the high-speed responsive power supply 23 from the reference voltage power supply 26 through the feeder line 32 so that the supply voltage V21 fed to the DUT 22 from the high-speed responsive power supply 23 can be maintained within a set value. Thereby, the potential difference between the supply voltage V21 and the power supply voltage V22 can be minimized.

Figure 4:
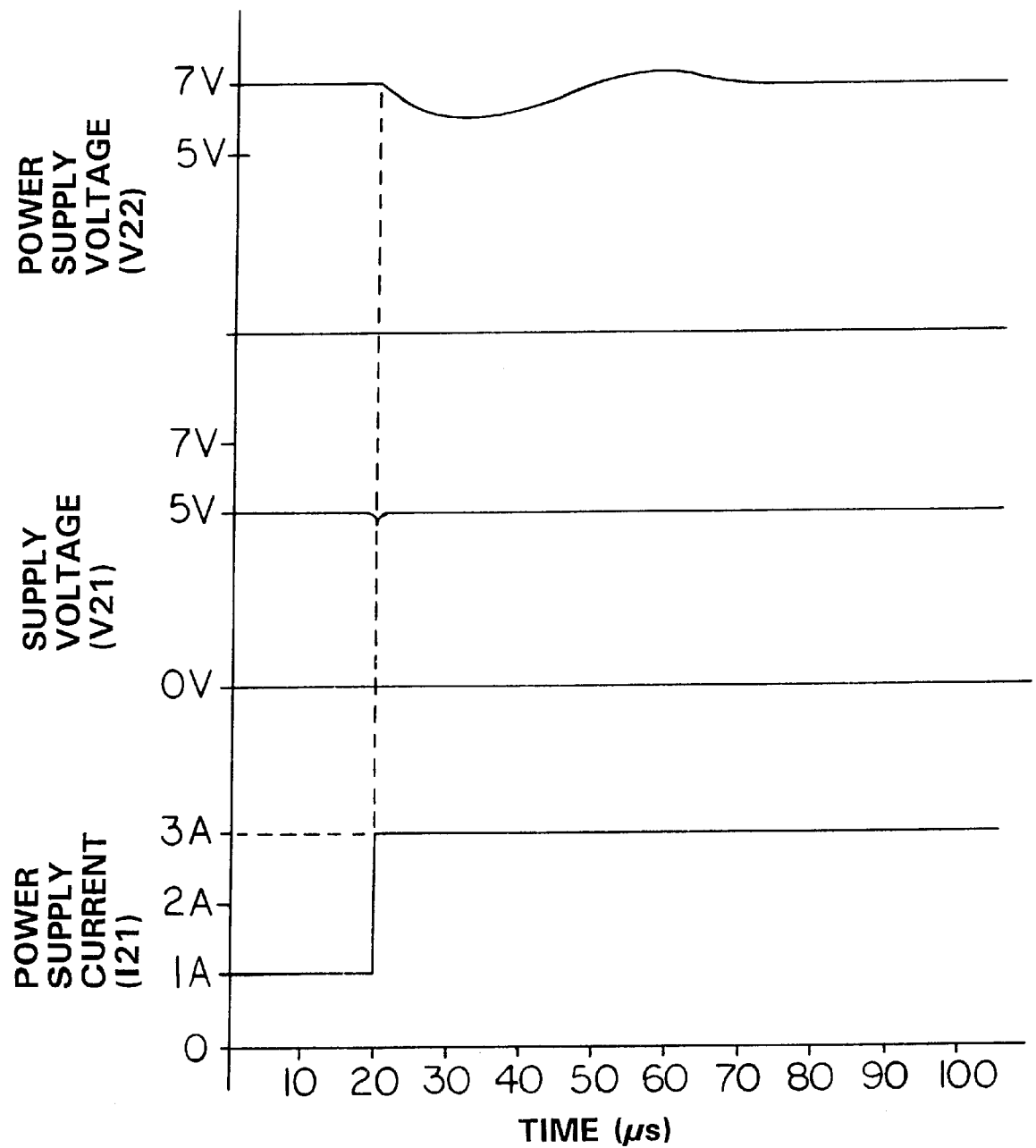
FIG. 4 is a transient response characteristics of the output supply voltage V21 and the power supply voltage V22 and the power supply current I21, for explaining the performance of the circuit shown in FIG. 3.

Consequently, as clearly seen in the transient response characteristics in FIG. 4, showing the relation between the time ($\mu$s) and the power supply voltage V22 including the supply voltage V21 and the power supply current I21, in such a case that the power supply current I21 running through the feeder line 27 into the DUT 22 from the emitter of the transistor 39 inside the high-speed responsive power supply 23 instantaneously rises from 1 A to 3A. The power supply voltage V22 supplied by the remote sensing power supply 25 fluctuates in some 10 ms, however, the fluctuation of the output voltage of the high-speed responsive power supply 23, that is, the supply voltage V21, can be suppressed still further.

Figure 5:
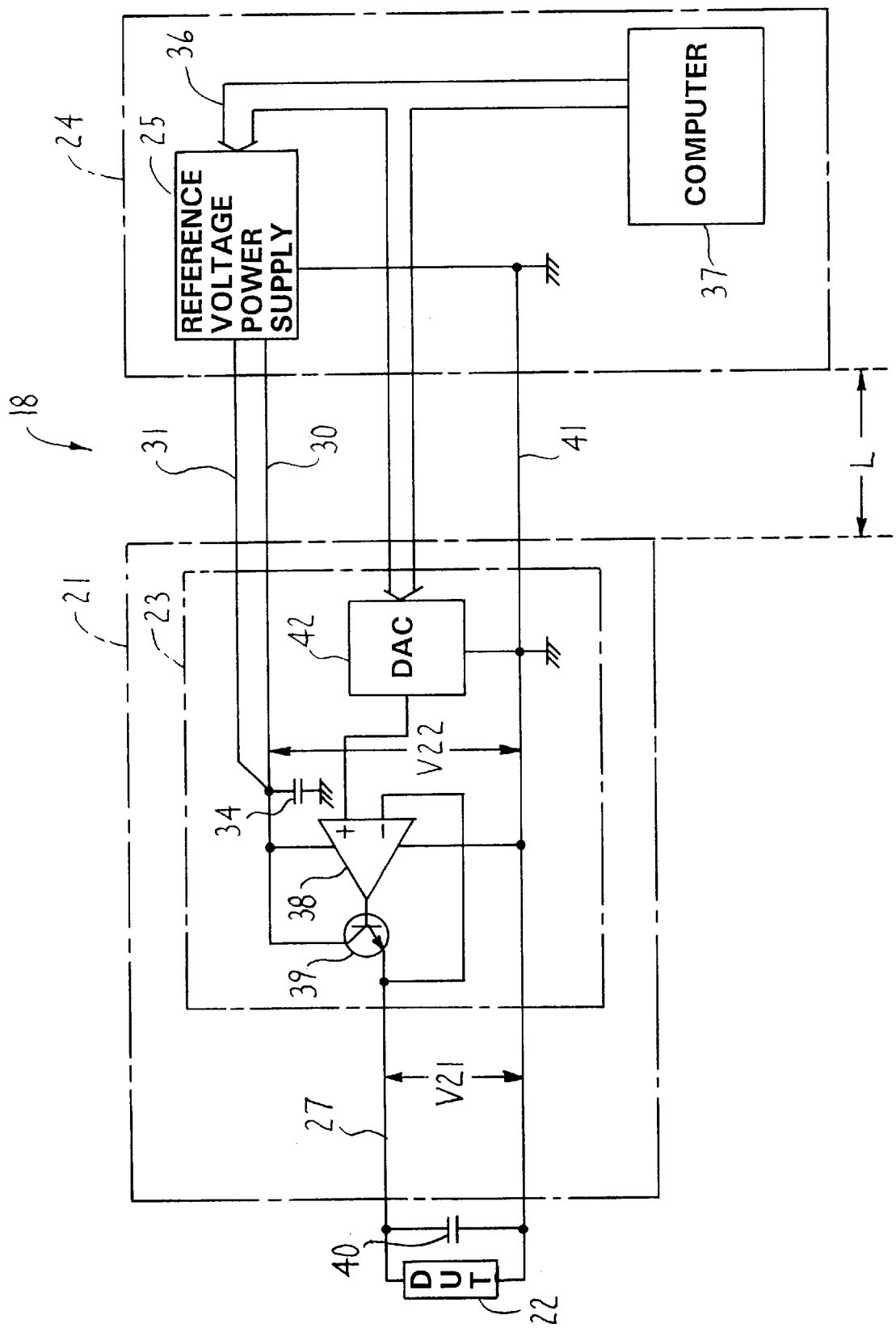
FIG. 5 is a circuit block diagram showing a construction of the high-speed responsive power supply for a measuring equipment relating to the third embodiment according to the invention.
Figure 6:
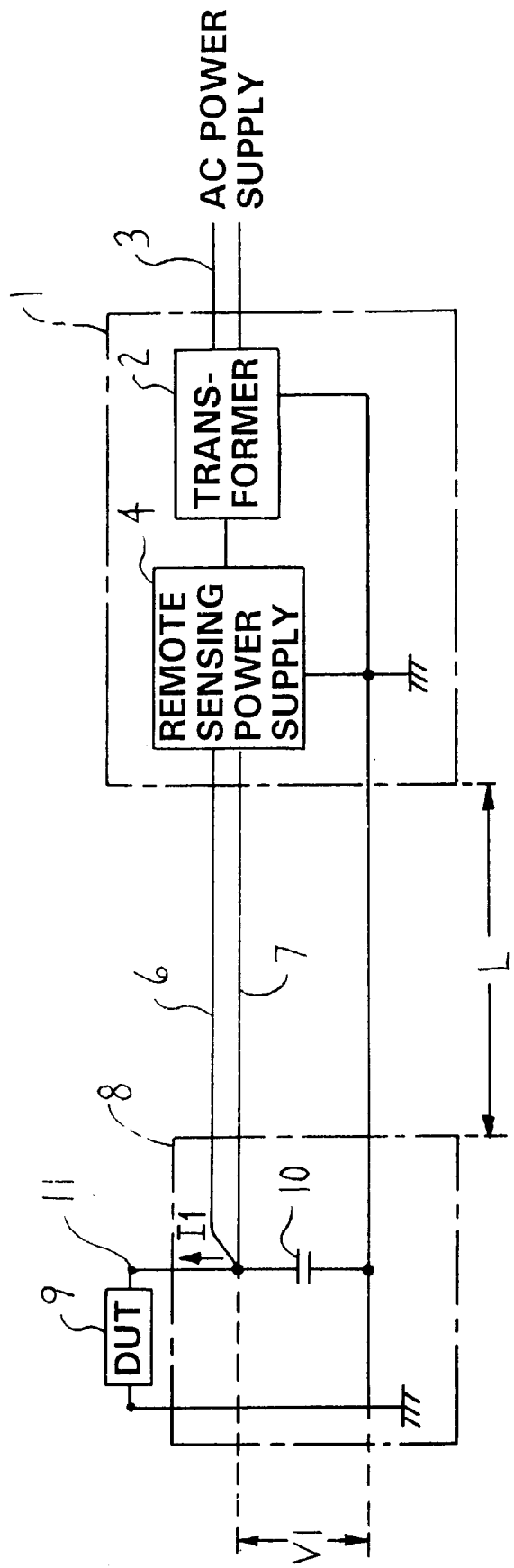
FIG. 6 is a circuit block diagram showing a construction of a power supply for the conventional IC tester.
Figure 7:
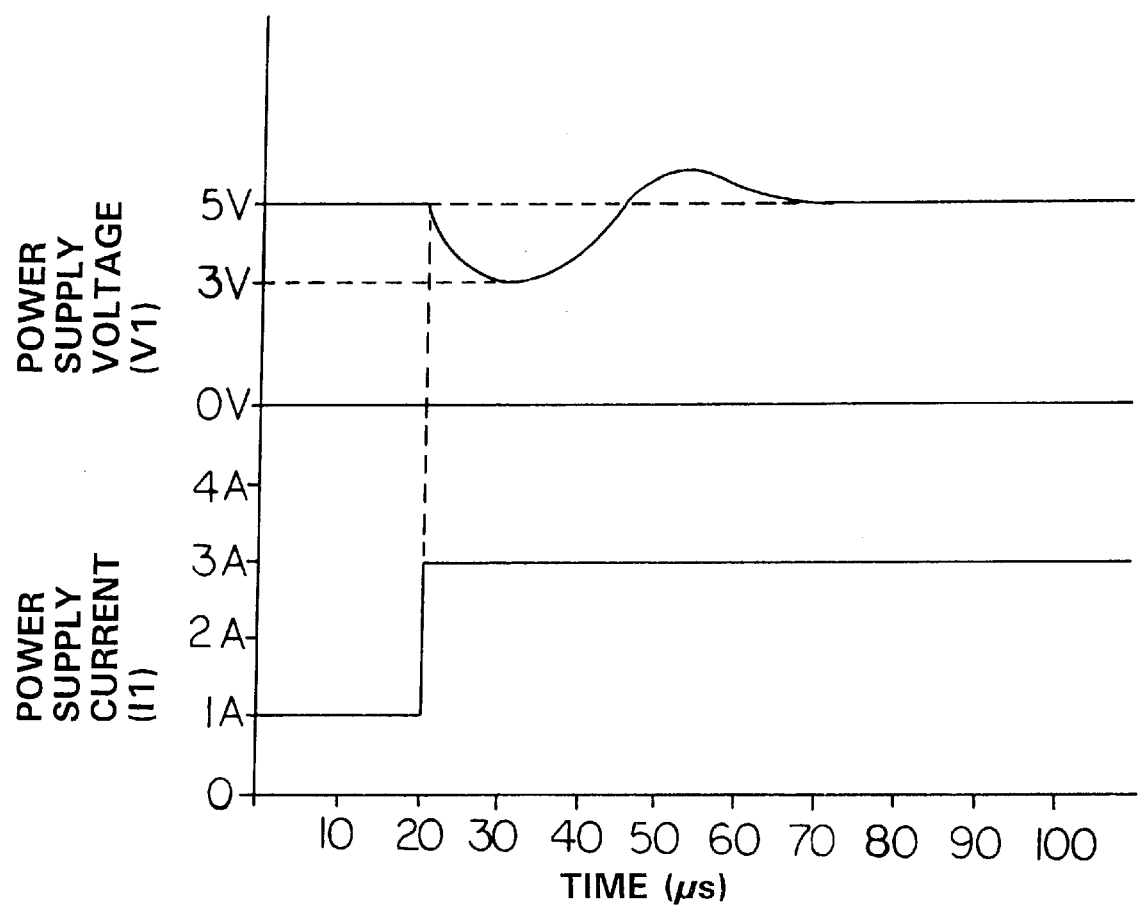
FIG. 7 a transient response characteristics of the power supply voltage V1 and the power supply current I1, for explaining the performance of the power supply for the IC tester shown in FIG. 6.

Next, the third embodiment according to the invention will be described with reference to FIG. 5. In order to avoid the repetitive description of the construction in FIG. 5, the same parts as in FIG. 3 are given the same reference numerals and the different parts will concentratedly be described.

As is clear in comparison of FIG. 5 to FIG. 3, the remote sensing power supply 26 inside the tester body rack 24 is omitted in FIG. 5, and a digital/analog converter 42 (hereinafter, referred to as DAC) is provided, in replacement of the remote sensing power supply 26 as the reference voltage supply means, inside the high-speed responsive power supply 23 mounted on the tester head 21.

The DAC 42 converts control signals transmitted from the computer 37 inside the tester body rack 24 through the data bus 36 into analog signals to supply the reference voltage to the op-amp 38 inside the high-speed responsive power supply 23. The other construction is the same as in FIG. 3.

Next, the performance of the circuit in FIG. 5 will be described. The remote sensing power supply 25 supplies the power supply voltage V22 to the op-amp 38 and the collector of the transistor 39 inside the high-speed responsive power supply 23 through the feeder line 30, and the power supply voltage V22 is detected by the remote sensing power supply 25 through the voltage detecting line 31.

On the basis of this detected voltage, the computer 37 controls the remote sensing power supply 25 through the data bus 36. Thereby, the power supply voltage V22 can be set such that the potential difference between the output supply voltage V21 applied to the DUT 22 from the emitter of the transistor 39 inside the high-speed responsive power supply 23 and the power supply voltage V22 becomes minimum with the high-speed responsive power supply 23 kept in the normal operation, and thereby the heating value of the high-speed responsive power supply 23 can be held minimum.

Furthermore, the computer 37 controls the DAC 42 through the data bus 36 so that the supply voltage V21 fed to the DUT 22 from the high-speed responsive power supply 23 will be equal to a set value. Thus, the fluctuation of the supply voltage V21 can be suppressed even when the power supply current I21 running through the feeder line 27 into the DUT 22 from the high-speed responsive power supply 23, that is, the load current significantly changes.

According to the high-speed responsive power supply for a measuring equipment 18 of the present invention, the high-speed responsive power supply 23 is provided inside the test head 21, which is supplied with the power supply voltage V22 from the remote sensing power supply 25 inside the tester body rack 24 disposed a specific distance apart from the test head. The supply voltage V21 is fed to the DUT 22 from the high-speed responsive power supply 23. The remote sensing power supply 25 controls the power supply voltage V22 so that the potential difference between the power supply voltage V22 and the supply voltage V21 will be minimized with the high-speed responsive power supply 23 kept in a normal operation. The reference voltage supply means, including DAC42, supplies the reference voltage to the high-speed responsive power supply. The supply voltage V21 fed to the DUT 22 is designed to become a set value;

and therefore, if the power supply current I21 running through the DUT changes significantly, the supply voltage fed to the DUT can be maintained to a set value, and the heating value of the high-speed responsive power supply 23 can be minimized.

While the specific embodiments of the present invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. Measuring equipment for supplying an output supply voltage to a device under test comprising:

the device under test detachably mounted on a test head of the measuring equipment;

a high-speed responsive power supply mounted on the test head and feeding the output supply voltage to the device under test;

a remote sensing power supply for feeding a power supply voltage to the high-speed responsive power supply, said remote sensing power supply being provided inside a tester body rack disposed a specific distance from the test head; and a reference voltage power supply for feeding a reference voltage to the high-speed responsive power supply, said reference voltage power supply also being provided inside the tester body rack.

2. The measuring equipment of claim 1, wherein the remote sensing power supply controls the power supply voltage fed to the high-speed responsive power supply so that a potential difference between the output supply voltage fed to the device under test from the high-speed responsive power supply and the power supply voltage fed to the high-speed responsive power supply from the remote sensing power supply will be minimized with the high-speed responsive power supply being maintained in a normal operation, and the reference voltage power supply controls the reference voltage fed to the high-speed responsive power supply.

3. The measuring equipment of claim 2, wherein the remote sensing power supply is controlled by a computer so that the potential difference between the output supply voltage fed to the device under test from the high-speed responsive power supply and the power supply voltage fed to the high-speed responsive power supply from the remote sensing power supply will be minimized with the high-speed responsive power supply being maintained in a normal operation.

4. The measuring equipment of claim 3, wherein the computer controls the reference voltage power supply comprising a digital-to-analog converter for supplying the reference voltage to the high-speed responsive power supply.

5. The measuring equipment of claim 1, wherein the remote sensing power supply is controlled by a computer so that the potential difference between the output supply voltage fed to the device under test from the high-speed responsive power supply and the power supply voltage fed to the high-speed responsive power supply from the remote sensing power supply will be minimized with the high-speed responsive power supply being maintained in a normal operation.

6. The measuring equipment of claim 1, wherein a computer controls the remote sensing power supply so that the potential difference between the supply voltage fed to the device under test from the high-speed responsive power supply and the power supply voltage fed to the high-speed responsive power supply from the remote sensing power supply will be minimized with the high-speed responsive power supply being maintained in a normal operation, and wherein the computer controls the reference voltage power supply comprising a digital-to-analog converter for supplying the reference voltage to the high-speed responsive power supply.

7. The measuring equipment of claim 1, wherein the output of the supply voltage comprises a substantially constant voltage.

8. Measuring equipment for supplying an output supply voltage to a device under test comprising:

a test head for detachably receiving the device under test;

a high-speed responsive power supply mounted on the test head and feeding the output supply voltage to the device under test;

a tester body rack;

a remote sensing power supply provided inside the tester body rack and feeding a power supply voltage to the high-speed responsive power supply; and a reference voltage power supply provided inside the tester body rack and feeding a reference voltage to the high-speed responsive power supply.

9. The measuring equipment of claim 8, wherein the output supply voltage comprises a substantially constant voltage.

10. The measuring equipment of claim 8, wherein the tester body rack is positioned a selected distance from the test head.

11. The measuring equipment of claim 8, wherein the remote sensing power supply controls the power supply voltage fed to the high-speed responsive power supply so that a potential difference between the output supply voltage fed to the device under test from the high-speed responsive power supply and the power supply voltage fed to the high-speed responsive power supply from the remote sensing power supply will be minimized with the high-speed responsive power supply being maintained in a normal operation, and the reference voltage power supply controls the reference voltage fed to the high-speed responsive power supply.

12. The measuring equipment of claim 11, wherein a computer controls the remote sensing power supply so that the potential difference between the output supply voltage fed to the device under test from the high-speed responsive power supply and the power supply voltage fed to the high-speed responsive power supply from the remote sensing power supply will be minimized with the high-speed responsive power supply being maintained in a normal operation.

13. The measuring equipment of claim 12, wherein the computer controls the reference voltage power supply comprising a digital-to-analog converter for supplying the reference voltage to the high-speed responsive power supply.

14. The measuring equipment as in claim 8, wherein a computer controls the remote sensing power supply so that the potential difference between the output supply voltage fed to the device under test from the high-speed responsive power supply and the power supply voltage fed to the high-speed responsive power supply from the remote sensing power supply will be minimized with the high-speed responsive power supply being maintained in a normal operation.

15. The measuring equipment as in claim 14, wherein the computer controls the reference voltage power supply comprising a digital-to-analog converter for supplying the reference voltage to the high-speed responsive power supply.

* * * * *